United States Patent
Ruppi et al.

(10) Patent No.: US 7,135,221 B2
(45) Date of Patent: Nov. 14, 2006

(54) COATED CUTTING INSERT FOR ROUGH TURNING

(75) Inventors: Sakari Ruppi, Fagersta (SE); Silvia Dahlund, Söderbärke (SE); Jenni Zackrisson, Fagersta (SE)

(73) Assignee: Seco Tools AB, Fagersta (SE)

( * ) Notice: Subject to any disclaimer, the term of this patent is extended or adjusted under 35 U.S.C. 154(b) by 87 days.

(21) Appl. No.: 10/973,899

(22) Filed: Oct. 27, 2004

(65) Prior Publication Data

US 2005/0129987 A1 Jun. 16, 2005

(30) Foreign Application Priority Data

Oct. 27, 2003 (SE) .................... 0302842

(51) Int. Cl.
*B32B 9/00* (2006.01)
(52) U.S. Cl. .................. 428/216; 51/307; 51/309; 407/119; 428/212; 428/336; 428/472; 428/325; 428/698; 428/701; 428/702
(58) Field of Classification Search .......... 51/307, 51/309; 407/119; 428/212, 216, 336, 472, 428/325, 698, 701, 702
See application file for complete search history.

(56) References Cited

U.S. PATENT DOCUMENTS

| 4,277,283 | A | 7/1981 | Tobioka et al. |
|---|---|---|---|
| 4,548,786 | A | 10/1985 | Yohe |
| 4,610,931 | A | 9/1986 | Nemeth et al. |
| 5,137,774 | A | 8/1992 | Ruppi |
| 5,487,625 | A * | 1/1996 | Ljungberg et al. .......... 428/698 |
| 5,654,035 | A | 8/1997 | Ljungberg et al. |
| 6,333,100 | B1 * | 12/2001 | Palmqvist et al. .......... 428/216 |
| 2004/0028951 | A1 | 2/2004 | Ruppi |

FOREIGN PATENT DOCUMENTS

| EP | 0 630 744 B | 12/1994 |
|---|---|---|
| EP | 1 026 271 A | 8/2000 |
| EP | 1 026 271 A1 | 8/2000 |
| EP | 1 247 789 A | 10/2002 |
| EP | 1 288 335 A | 3/2003 |
| EP | 1 348 779 A1 | 10/2003 |

* cited by examiner

*Primary Examiner*—Archene Turner
(74) *Attorney, Agent, or Firm*—Drinker Biddle & Reath LLP

(57) ABSTRACT

A cutting tool insert with a cemented carbide and a coating. The cemented carbide substrate includes WC, 7 to 12 wt-% Co, 5 to 11 wt-% cubic carbides of metals from the groups IVb, Vb and VIb with a binder phase that is highly alloyed with cobalt. The tungsten carbide phase has a mean intercept length of 0.7 to 1.4 μm. The coating includes at least one 2 to 12 μm thick $\alpha$-$Al_2O_3$ layer composed of columnar grains with texture coefficients: $TC(012)>2.2$ and $TC(024)>0.6 \times TC(012)$.

26 Claims, 2 Drawing Sheets

COATED CUTTING INSERT FOR ROUGH TURNING

RELATED APPLICATION DATA

Figure 1:
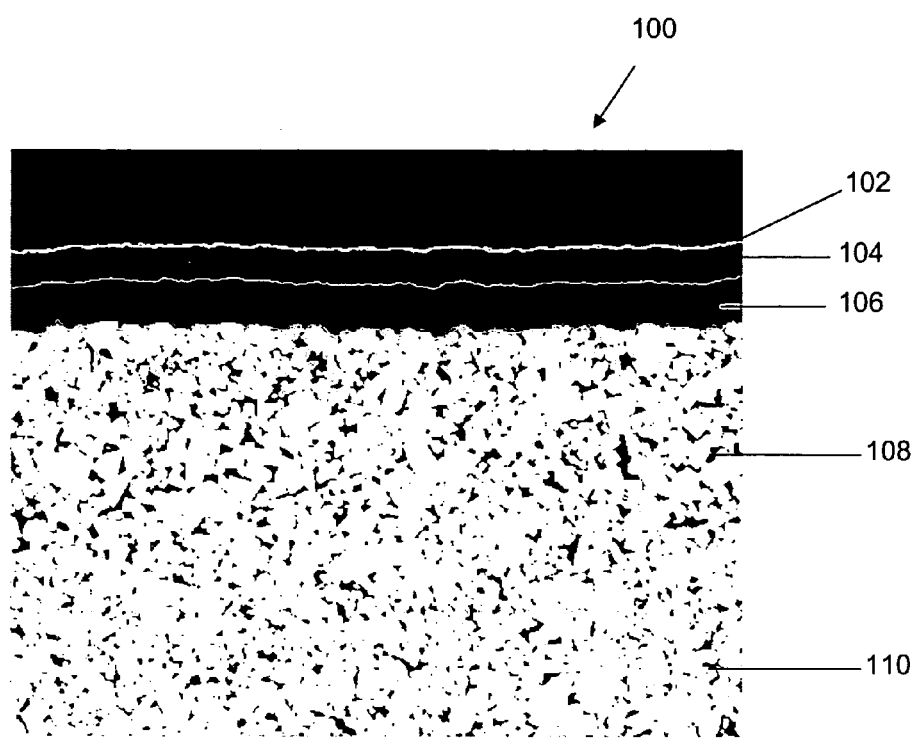

This application is based on and claims priority under 35 U.S.C. §119 to Swedish Application No. 0302842-0, filed Oct. 27, 2003, the entire contents of which are incorporated herein by reference.

FIELD OF THE DISCLOSURE

The present disclosure relates to a coated cemented carbide cutting tool insert particularly useful for toughness demanding machining, such as medium and rough turning of steels and also for turning of stainless steels. The disclosure preferably relates to coated inserts in which the substrate has been provided with a tough surface region in such a way that wear resistance and edge strength are obtained in the same grade.

STATE OF THE ART

In the discussion of the state of the art that follows, reference is made to certain structures and/or methods. However, the following references should not be construed as an admission that these structures and/or methods constitute prior art. Applicants expressly reserve the right to demonstrate that such structures and/or methods do not qualify as prior art against the present invention.

Today, coated cemented carbide inserts with binder phase enriched surface zone are commonly used for turning of steel and stainless steel materials. The binder phase enriched surface zone widens the application towards tougher cutting operations.

It has been known for some time how to produce binder phase enriched surface zones on cemented carbides containing WC, binder phase and cubic carbide phase, e.g., Tobioka et al. (U.S. Pat. No. 4,277,283), Nemeth et al. (U.S. Pat. No. 4,610,931) and Yohe (U.S. Pat. No. 4,548,786).

EP-A-1 026 271 relates to a coated cemented carbide with binder phase highly alloyed with W. The insert has a binder phase enriched surface zone of a thickness <20 μm and, along a line in the direction from the edge to the centre of the insert, the binder phase content increases essentially monotonously until it reaches the bulk composition. The insert is coated with 3–12 μm columnar Ti(C,N)-layer followed by a 2–12 μm thick $Al_2O_3$-layer.

EP-A-1 348 779 relates to a coated cemented carbide insert with a binder phase enriched surface zone with a thickness of >20 μm and a Co-content of 4–7 wt-%. The insert is coated with a 3–15 μm thick Ti(C,N) layer followed by 3–15 μm $\alpha$-$Al_2O_3$ and an uppermost 1–10 μm thick layer of a carbide, carbonitride or carboxynitride.

Swedish Patent Application 0201417-3 discloses a method to produce $\alpha$-$Al_2O_3$ coatings with high wear resistance and toughness. The $\alpha$-$Al_2O_3$ coating is formed on a bonding layer of (Ti,Al)(C,O,N) with increasing aluminum content towards the outer surface. The $\alpha$-$Al_2O_3$ coating has a thickness ranging from 1 to 20 μm and is composed of columnar grains. The length/width ratio of the alumina grains is from 2 to 12. The coating is characterized by a strong (012) growth texture, measured using XRD, and by the almost total absence of (104), (110), (113) and (116) diffraction reflections.

The coatings for cutting tools designed for toughness demanding applications are usually composed of layers of Ti(C,N) and kappa alumina. It has been thought that the kappa phase shows better toughness properties than the alpha phase. Consequently, alpha alumina has so far only been applied for applications where wear resistance is the main concern, i.e., for grades with relatively low Co-contents.

SUMMARY

It has surprisingly been found that a relatively thick coating including alpha alumina ($\alpha$-$Al_2O_3$) with strong texture in combination with a substrate of relatively high cobalt content shows enhanced edge strength and toughness in medium and rough turning of steels and turning of stainless steels.

An exemplary embodiment of a cutting tool insert comprises a cemented carbide substrate and a coating. The cemented carbide substrate comprises WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89 and a tungsten carbide phase having a mean intercept length of 0.7 to 1.4 μm. The coating comprises at least one 2 to 12 μm alumina layer including columnar $\alpha$-$Al_2O_3$ grains and a texture coefficient TC(hkl) of (hkl) reflections (012), (104), (110), (113), (024), (116), wherein TC(012)>2.2 and TC(024)>0.6×TC(012), and wherein texture coefficient TC(hkl) is defined as $$TC(hkl) = \frac{I(hkl)}{I_0(hkl)} \left[ \frac{1}{n} \sum \frac{I(hkl)}{I_0(hkl)} \right]^{-1}$$

where I(hkl)=measured intensity of (hkl) reflection, $I_0$(hkl) =standard intensity according to JCPDS card no 46-1212, and n=number of reflections used in calculation.

Another exemplary embodiment of a cutting tool insert comprises a cemented carbide substrate and a coating. The cemented carbide substrate consists essentially of WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89, a tungsten carbide phase having a mean intercept length of 0.7 to 1.4 μm. The coating consists essentially of at least one 2 to 12 μm alumina layer including columnar $\alpha$-$Al_2O_3$ grains and a texture coefficient TC(hkl) of (hkl) reflections (012), (104), (110), (113), (024), (116), wherein TC(012)>2.2 and TC(024)>0.6×TC(012) and wherein texture coefficient TC(hkl) is defined as $$TC(hkl) = \frac{I(hkl)}{I_0(hkl)} \left[ \frac{1}{n} \sum \frac{I(hkl)}{I_0(hkl)} \right]^{-1}$$

where I(hkl)=measured intensity of (hkl) reflection, $I_0$(hkl) =standard intensity according to JCPDS card no 46-1212, and n=number of reflections used in calculation.

A further exemplary embodiment of a cutting tool insert comprises a cemented carbide substrate and a coating. The cemented carbide substrate comprises WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89, a tungsten carbide phase having a mean intercept length of 0.7 to 1.4 μm and wherein the cemented carbide substrate includes a binder phase enriched and an essentially cubic carbide free surface zone of a thickness of 10 to 40 µm. The coating comprises at least one 2 to 12 µm alumina layer including columnar α-Al$_2$O$_3$ grains having a length to width ratio from 2 to 10 and a texture coefficient TC(hkl) of (hkl) reflections (012), (104), (110), (113), (024), (116), and wherein TC(012)>2.2 and TC(024)>0.6×TC(012), and wherein texture coefficient TC(hkl) is defined as $$TC(hkl) = \frac{I(hkl)}{I_0(hkl)} \left[ \frac{1}{n} \sum \frac{I(hkl)}{I_0(hkl)} \right]^{-1}$$

where I(hkl)=measured intensity of (hkl) reflection, I$_0$(hkl) =standard intensity according to JCPDS card no 46-1212, and n=number of reflections used in calculation. The coating further comprises a first layer adjacent the cemented carbide substrate including CVD Ti(C,N), CVD TiN, CVD TiC, MTCVD Ti(C,N), MTCVD Zr(C,N), MTCVD Ti(B,C,N), CVD HfN or combinations thereof, the first layer having a thickness of from 1 to 10 µm.

BRIEF DESCRIPTION OF THE DRAWING FIGURES

The following detailed description of preferred embodiments can be read in connection with the accompanying drawings in which like numerals designate like elements and in which:

FIG. 1 shows the structure of the tool insert according to an embodiment of the invention in approximately 1200× magnification.

Figure 2A:
Figure 2B:
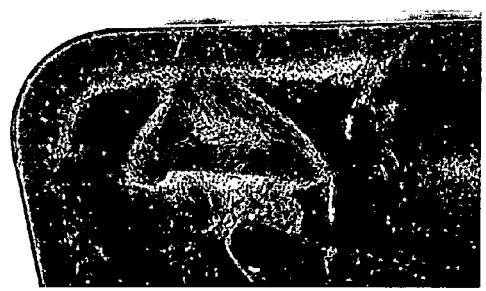

FIGS. 2A and 2B show the wear of the cutting edges after the machining test in Example 4. FIG. 2A is a prior art insert; FIG. 2B is an embodiment of an inventive insert.

Figure 3:
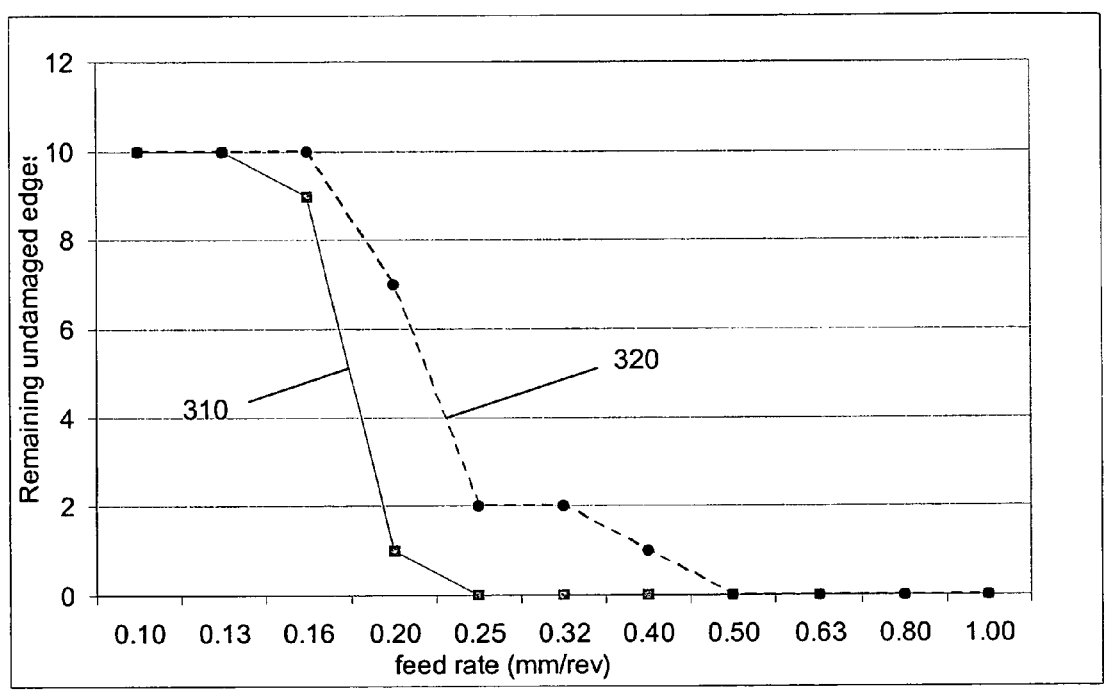

FIG. 3 shows the number of undamaged cutting edges vs. feed in the cutting test in Example 5.

DETAILED DESCRIPTION OF THE PREFERRED EMBODIMENT

A coated cutting tool insert is provided consisting of a cemented carbide body with a composition of 7 to 12 wt-%, preferably 8 to 11 wt-%, most preferably 8.5 to 9.5 wt-% Co, 5 to 11 wt-%, preferably 6.5 to 9.5 wt-%, cubic carbides of the metals from groups IVb, Vb and VIb of the periodic table, preferably Ti, Nb and Ta, and balance WC. The ratio between the weight concentrations of Ta and Nb, e.g., Ta:Nb, is within 1.0 to 3.0, preferably 1.5 to 2.5. The ratio between the weight concentrations of Ti and Nb, e.g., Ti:Nb, is within 0.5 to 1.5, preferably 0.8 to 1.2.

The cobalt binder phase is highly alloyed with tungsten. The concentration of W in the binder phase may be expressed as the S-value=σ/16.1, where σ is the measured magnetic moment of the binder phase in µTm$^3$kg$^{-1}$. The S-value depends on the content of tungsten in the binder phase and increases with a decreasing tungsten content. Thus, for pure cobalt, or a binder that is saturated with carbon, S=1 and for a binder phase that contains W in an amount that corresponds to the borderline to formation of η-phase, S=0.78.

It has now been found that improved cutting performance is achieved if the cemented carbide body has an S-value within the range 0.79 to 0.89, preferably 0.81 to 0.85.

Furthermore, the mean intercept length of the tungsten carbide phase measured on a ground and polished representative cross section is in the range 0.7 to 1.4 µm, preferably 0.9 to 1.3 µm, most preferably 1.1 to 1.3 µm. The intercept length is measured by means of image analysis on images with a magnification of 10000× and calculated as the average mean value of approximately 1000 intercept lengths.

In one embodiment, the cemented carbide is made with all three phases homogeneously distributed in the material.

In a preferred embodiment, the cemented carbide is provided with a 10 to 40 µm thick, preferably 20 to 40 µm thick, most preferably 20 to 30 µm thick, essentially cubic carbide phase free and binder phase enriched surface zone with an average binder phase content in the range 1.2 to 2.5 times the nominal binder phase content.

FIG. 1 shows a cross-sectional image of the microstructure of a tool insert according to an embodiment of the invention in approximately 1200× magnification. The tool insert 100 in the FIG. 1 image includes a substrate with a substrate interior 110 and a binder phase enriched surface zone 108. The binder phase enriched zone is also preferably essentially cubic carbide phase free. The coating depicted in FIG. 1 includes a layer of Ti(C,N) 106 applied directly to the substrate, a layer of α-Al$_2$O$_3$ 104 applied to the layer of Ti(C,N) 106, and an outermost layer of TiN 102 applied to the layer of α-Al$_2$O$_3$ 104.

A method of making cutting tool inserts as described herein is also provided. According to a preferred embodiment, a powder mixture is formed containing 7 to 12 wt-%, preferably 8 to 11 wt-%, of binder phase consisting of Co, and 5 to 11 wt-%, preferably 6.5 to 9.5 wt-%, cubic carbides of the metals from groups IVb, Vb and VIb of the periodic table, preferably Ti, Nb and Ta, and balance WC. The ratio between the weight concentrations of Ta and Nb is within 1.0 to 3.0, preferably 1.5 to 2.5. The ratio between the weight concentrations of Ti and Nb is within 0.5 to 1.5, preferably 0.8 to 1.2. Well-controlled amounts of nitrogen are added through the powder, e.g., as nitrides. The optimum amount of nitrogen to be added depends on the composition of the cemented carbide and in particular on the amount of cubic phases and is higher than 1.7%, preferably 1.8 to 5.0%, most preferably 3.0 to 4.0 wt-%, of the weight of the elements from groups IVb and Vb of the periodic table. The exact conditions depend to a certain extent on the design of the sintering equipment being used. It is within the purview of the skilled artisan to determine and to modify the nitrogen addition and the sintering process in accordance with the present specification in order to obtain the desired result.

The raw materials are mixed with a pressing agent and optionally W such that the desired S-value is obtained and the mixture is milled and spray dried to obtain a powder material with the desired properties. Next, the powder material is compacted and sintered. Sintering is performed at a temperature of 1300 to 1500° C., in a controlled atmosphere of about 50 mbar followed by cooling. After conventional post sintering treatments including edge rounding, a hard, wear resistant coating according to the below is applied by CVD- or MT-CVD-technique.

The coating comprises a first layer adjacent the body of CVD Ti(C,N), CVD TiN, CVD TiC, MTCVD Ti(C,N), MTCVD Zr(C,N), MTCVD Ti(B,C,N), CVD HfN or combinations thereof preferably of MTCVD Ti(C,N) having a thickness of from 1 to 10 µm, preferably from 3 to 8 µm, most preferably about 6 µm and α-Al$_2$O$_3$ layer adjacent said first layer having a thickness of from about 2 to 12 µm, preferably from 3 to 10 µm, most preferably about 5 µm. Preferably there is an intermediate layer of TiN between the substrate as well as in the said first layer both with a thickness of <3 µm, preferably about 0.5 µm.

In one embodiment the α-Al$_2$O$_3$ layer is the uppermost layer. In a preferred embodiment, there is a layer of carbide, nitride, carbonitride or carboxynitride of one or more of Ti, Zr and Hf, having a thickness of from about 0.5 to 3 μm, preferably 0.5 to 1.5 μm atop the α-Al$_2$O$_3$ layer.

The total coating thickness is preferably 7 to 15 μm, more preferably 8 to 13 μm.

The α-Al$_2$O$_3$ layer is composed of columnar grains with a strong (012) texture. The columnar grains have a length/width ratio of from 2 to 10, preferably 4 to 8, with a width of 0.5 to 3.0 μm, preferably 0.5 to 2.0, most preferably 0.5 to 1.5.

The texture coefficients (TC) for the α-Al$_2$O$_3$ layer is determined as follows:

$$TC(hkl) = \frac{I(hkl)}{I_0(hkl)} \left[ \frac{1}{n} \sum \frac{I(hkl)}{I_0(hkl)} \right]^{-1} \quad \text{(Eq. 1)}$$

where
I(hkl)=intensity of the (hkl) reflection
I$_0$(hkl)=standard intensity according to JCPDS card no 46-1212
n=number of reflections used in the calculation
(hkl) reflections used are: (012), (104), (110), (113), (024), (116).

The texture of the alumina layer is defined as follows: TC(012)>2.2, preferably 2.5 to 3.5 and the related TC(024) >0.6×TC(012). In addition, in some embodiments TC(104), TC(110), TC(113), TC(116) are simultaneously each less than 0.4, preferably each less than 0.3. It is noted that the intensities of the planes 012 and 024 are related.

In an exemplary embodiment, α-Al$_2$O$_3$ is deposited on a Ti(C,N) coating, which is obtained preferably by MTCVD. Several steps can optionally be used to control nucleation as described in Swedish Patent Application 0201417-3. In an exemplary embodiment, a modified bonding layer of α-Al$_2$O$_3$ is deposited on the Ti(C,N) layer characterized by the presence of an Al concentration gradient. The controlled oxidation treatment is performed in this case using a CO$_2$/H$_2$/N$_2$ gas mixture, resulting in a lower O-potential than in SE 0201417-3, enhancing the (012) texture further. The oxidation step is short and may be followed by a short treatment with a AlCl$_3$/H$_2$ mixture, again followed by a short oxidation step. This kind of pulsating (Al-treatments/oxidation) treatments create favorable nucleation sites for α-Al$_2$O$_3$ and a strong (012) texture. The growth of the alumina layer onto the surface modified bonding layer is started by sequencing the reactant gases in the following order: CO, AlCl$_3$, CO$_2$. The temperature is preferably about 1000° C. For contrast, a conventional bonding layer is described in U.S. Pat. No. 5,137,774 (referred to as kappa-bonding), the entire contents of which are incorporated herein by reference.

EXAMPLE 1

Invention

A cemented carbide substrate in accordance with the present disclosure has a composition 9.0 wt-% Co, 3.6 wt-% TaC, 2.2 wt-% NbC, 2.9 wt-% (Ti,W)C 50/50 (H. C. Starck), 1.1 wt-% TiN and balance WC, with a binder phase alloyed with W corresponding to an S-value of 0.83. Inserts were produced by conventional milling of the raw material powders, pressing of green compacts and subsequent sintering at 1430° C. Investigation of the microstructure after sintering showed that the cemented carbide inserts had a cubic carbide free zone with a thickness of 22 μm. The cobalt concentration in the zone was 1.4 times that in the bulk of the substrate. The mean intercept length of the tungsten carbide phase was 1.2 μm.

EXAMPLE 2

Cemented carbide cutting inserts from Example 1 were coated with a layer of MTCVD Ti(C,N) according to step 1 (below). The thickness of the MTCVD layer was about 6 μm.

Step 1: MTCVD Coating

| Gas mixture | TiCl$_4$ = 4.0% |
| --- | --- |
| | CH$_3$CN = 1.0% |
| | N$_2$ = 20% |
| | Balance: H$_2$ |
| Duration | 150 min |
| Temperature | 850° C. |
| Pressure | 100 mbar |

Onto this layer of MCTVD Ti(C,N), the following alumina layers, e.g., the layers disclosed at (a), (b) or (c) below, were deposited:

(a) 5 μm α-Al$_2$O$_3$ was deposited according to steps 2–6: (Invention).

Step 2: Bonding Layer

| Gas mixture | TiCl$_4$ = 2.8% |
| --- | --- |
| | AlCl$_3$ = 0.8–4.2% |
| | CO = 5.8% |
| | CO$_2$ = 2.2% |
| | N$_2$ = 5–6% |
| | Balance: H$_2$ |
| Duration | 60 min |
| Temperature | 1000° C. |
| Pressure | 100 mbar |

Step 3: Aluminizing Step

| Gas mixture | AlCl$_3$ = 0.8–4.2% |
| --- | --- |
| | Balance: H$_2$ |
| Duration | 15 min or 2 min pulsating |
| Temperature | 1000 C. |
| Pressure | 50 mbar |

Step 4: Oxidizing Step

| Gas mixture | CO$_2$ = 0.1% |
| --- | --- |
| | Balance: H$_2$ + 20% N$_2$ |
| Duration | 2 min or 20 s pulsating |
| Temperature | 1000° C. |
| Pressure | 100 mbar |

Step 5: Nucleation Step

| Gas mixture | AlCl$_3$ = 3.2% |
| --- | --- |
| | HCL = 2.0% |
| | CO$_2$ = 1.9% |
| | Balance H$_2$ |
| Duration | 60 min |
| Temperature | 1000° C. |
| Pressure | 210 mbar |

Step 6: Deposition

| | |
|---|---|
| Gas mixture | $AlCl_3$ = 3.9% |
| | HCL = 1.5% |
| | $CO_2$ = 6.2% |
| | $H_2S$ = 0.2% |
| | Balance: $H_2$ |
| Duration | 300 min |
| Temperature | 1000° C. |
| Pressure | 50 mbar |

(b) 5 μm $κ-Al_2O_3$ was deposited according to the prior art, where the $κ-Al_2O_3$ layer was deposited without oxidation resulting in epitaxial growth of $κ-Al_2O_3$ on the Ti(C,N) of step 1.

(c) 5 μm $α-Al_2O_3$ deposited according to prior art. The nucleation control did not in this case produce 100% pure $α-Al_2O_3$ but instead a mixture of $κ-Al_2O_3$ and $α-Al_2O_3$ was produced. As a result, the $κ-Al_2O_3$ phase transformed during the deposition process to $α-Al_2O_3$ with a high dislocation density.

The total coating thickness of the experimental coatings was 11 μm in all cases.

EXAMPLE 3

The inserts from Example 2a and 2c (alpha oxides) were studied by using XRD. Coating 2c exhibited a random texture but the coating 2a according to this invention showed a clear (012) texture. Table 1 shows the obtained texture coefficients for coating 2a.

TABLE 1

| hkl | Coating 2a |
|---|---|
| 012 | 3.39 |
| 104 | 0.11 |
| 110 | 0.22 |
| 113 | 0.15 |
| 024 | 2.04 |
| 116 | 0.09 |

EXAMPLE 4

Inserts according to coating 2a from Example 2 were tested against inserts according to prior art (coating 2c from Example 2) under the following conditions.

| | |
|---|---|
| Work piece: | Cylindrical bar |
| Insert type: | CNMG120408-M3 |
| Cutting speed | 220 m/min |
| Feed: | 0.4 mm/rev |
| Depth of cut: | 2.5 mm |
| Time in cut: | 4.7 min |
| Remarks: | Interrupted cut without coolant |

The cutting edges are shown in FIG. 2 after 4.7 min cutting. The inserts produced according to prior art, shown in FIG. 2A, reveals severe edge chipping and crater wear. In contrast, inserts produced according to the invention, shown in FIG. 2B, do not reveal any chipping. The wear on the inserts in FIG. 2B was very uniform and the inserts could have been used much longer.

This demonstrates that the $α-Al_2O_3$ with a texture according to the invention has a much tougher and wear resistant behavior than the $α-Al_2O_3$ produced according to prior art.

EXAMPLE 5

Inserts from Example 2 with coatings 2a and 2b were compared in metal cutting. Coating 2a is composed of defect free $α-Al_2O_3$ according to the invention and coating 2b is composed of $κ-Al_2O_3$ according to prior art. The test conditions were the following:

| | |
|---|---|
| Work piece: | Cylindrical slotted bar |
| Material: | SS1672-08 |
| Insert type: | CNMG120408-M5 |
| Cutting speed | 80 m/min |
| Feed: | 0.1, 0.125, 0.16, 0.20, 0.315, 0.4, 0.5, 0.63, 0.8, 1.0 mm/rev gradually increased after 10 mm length of cut |
| Depth of cut: | 2.0 mm |
| Remarks: | Interrupted machining mode test without coolant. |
| Tool life criteria: | Gradually increased feed until breakage. 10 edges of each variant were tested. |

The results are presented in FIG. 3. FIG. 3 plots remaining undamaged edges after increasing feed rate as a function of feed rate (mm/rev). Both kappa-alumina ($κ-Al_2O_3$) results 310 and alpha-alumina ($α-Al_2O_3$) results 320 are shown.

The results in FIG. 3, indicate the inserts according to the invention composed of $α-Al_2O_3$ with a texture as disclosed herein exhibited a much better toughness than inserts with $κ-Al_2O_3$ produced according to prior art.

EXAMPLE 6

The coatings 2a and 2b from Example 2 were tested under the following conditions.

| | |
|---|---|
| Work piece: | Cylindrical bar |
| Material: | SS1672-08 |
| Insert type: | CNMG120408-M5 |
| Cutting speed | 250 m/min |
| Feed: | 0.4 mm/rev |
| Depth of cut: | 2.0 mm |
| Time in cut: | 3.6 min |
| Remarks: | Interrupted machining mode test without coolant; three edges of each variant were tested. |

The prior art inserts coated with $κ-Al_2O_3$ had severe plastic deformation after 3.6 min cutting while those produced according to the invention exhibited very little plastic deformation. The superiority of $α-Al_2O_3$ to prevent plastic deformation is clear.

EXAMPLE 7

The following three variants were tested by interrupted turning of stainless steel.
a. Invention Example 2a
b. Strongly leading grade from Competitor 1 for interrupted turning of stainless steel.
c. Strongly leading grade from Competitor 2 for interrupted turning of stainless steel.

| | |
|---|---|
| Work piece: | Cylindrical bar |
| Material: | SS2343 |
| Insert type: | CNMG120408-M3 |
| Cutting speed | 150 m/min |
| Feed: | 0.4 mm/rev |

-continued

| | |
|---|---|
| Depth of cut: | 2.0 mm |
| Time in cut: | 7.6 min |
| Remarks: | Interrupted machining mode test with coolant; three edges of each variant were tested. |

After 7.6 minutes, the flank wear of the three variants was measured:

| Variant | Flank wear (mm) |
|---|---|
| a. Invention | 0.20 |
| b. Competitor 1 | 0.29 |
| c. Competitor 2 | 0.26 |

The results show that the cemented carbide tool with a layer of $\alpha$-Al$_2$O$_3$ with a texture as disclosed herein exhibits enhanced tool life as compared with competitor products.

EXAMPLE 8

The same variants that were tested in Examples 5 and 6 were also tested in continuous turning in ordinary carbon steel. The cutting data were:

| | |
|---|---|
| Work piece: | Cylindrical bar |
| Material: | SS1672-08 |
| Insert type: | CNMG120412-M3 |
| Cutting speed: | 300 m/min |
| Feed: | 0.4 mm/rev |
| Depth of cut: | 2.0 mm |
| Remarks: | Continuous cut with coolant |
| Tool life criterion: | Flank wear >0.3 mm, three edges of each variant were tested. |
| Results | Tool life (min) |
| Invention | 9.0 |
| Prior Art | 6.0 |

The test results show that the cemented carbide disclosed herein, i.e., with a coating layer of $\alpha$-Al$_2$O$_3$ with a texture as disclosed herein, exhibits longer tool life than prior art material with $\kappa$-Al$_2$O$_3$ in continuous cutting. Thus, the examples above show that the cemented carbide according to the invention is superior to prior art materials both regarding wear resistance and toughness.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A cutting tool insert comprising:
a cemented carbide substrate; and
a coating,
wherein the cemented carbide substrate comprises WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89, a tungsten carbide phase having a mean intercept length of 0.7 to 1.4 μm,
wherein the coating comprises at least one 2 to 12 μm alumina layer including columnar $\alpha$-Al$_2$O$_3$ grains and a texture coefficient TC(hkl) of (hkl) reflections (012), (104), (110), (113), (024), (116),
wherein TC(012)>2.2 and TC(024)>0.6×TC(012), and
wherein texture coefficient TC(hkl) is defined as $$TC(hkl) = \frac{I(hkl)}{I_0(hkl)} \left[ \frac{1}{n} \sum \frac{I(hkl)}{I_0(hkl)} \right]^{-1}$$

where
I(hkl)=measured intensity of (hkl) reflection
I$_0$(hkl)=standard intensity according to JCPDS card no 46-1212
n=number of reflections used in calculation.

2. The cutting tool insert according to claim 1, wherein the columnar $\alpha$-Al$_2$O$_3$ grains have a length/width ratio from 2 to 10.

3. The cutting tool insert according to claim 2, wherein the length/width ratio is 4 to 8.

4. The cutting tool insert according to claim 1, comprising a first layer adjacent the cemented carbide substrate including CVD Ti(C,N), CVD TiN, CVD TiC, MTCVD Ti(C,N), MTCVD Zr(C,N), MTCVD Ti(B,C,N), CVD HfN or combinations thereof, the first layer having a thickness of from 1 to 10 μm.

5. The cutting tool insert according to claim 4, wherein the thickness of the first layer is 3 to 8 μm.

6. The cutting tool insert according to claim 5, wherein the thickness of the first layer is about 6 μm.

7. The cutting tool insert according to claim 4, wherein the first layer includes MTCVD Ti(C,N).

8. The cutting tool insert according to claim 1, wherein a total thickness of the coating is 7 to 15 μm.

9. The cutting tool insert according to claim 8, wherein the total thickness of the coating is 8 to 13 μm.

10. The cutting tool insert according to claim 4, wherein the coating comprises a modified bonding layer including an Al concentration gradient positioned between the first layer and the alumina layer.

11. The cutting tool insert according to claim 1, wherein the mean intercept length of the tungsten carbide phase is 0.9 to 1.3 μm.

12. The cutting tool insert according to claim 1, wherein the cemented carbide substrate includes a binder phase enriched and an essentially cubic carbide free surface zone of a thickness of 10 to 40 μm.

13. The cutting tool insert according to claim 1, wherein TC(012) is 2.5 to 3.5.

14. The cutting tool insert according to claim 1, wherein TC(104), TC(110), TC(113), TC(116) are each less than 0.4.

15. The cutting tool insert according to claim 1, wherein TC(104), TC(110), TC(113), TC(116) are each less than 0.3.

16. A cutting tool insert comprising:
a cemented carbide substrate; and
a coating,
wherein the cemented carbide substrate consists essentially of WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89, a tungsten carbide phase having a mean intercept length of 0.7 to 1.4 μm,
wherein the coating consists essentially of at least one 2 to 12 μm alumina layer including columnar $\alpha$-Al$_2$O$_3$ grains and a texture coefficient TC(hkl) of (hkl) reflections (012), (104), (110), (113), (024), (116), wherein TC(012)>2.2 and TC(024)>0.6×TC(012), and wherein texture coefficient TC(hkl) is defined as $$TC(hkl) = \frac{I(hkl)}{I_0(hkl)}\left[\frac{1}{n}\sum\frac{I(hkl)}{I_0(hkl)}\right]^{-1}$$

where
I(hkl)=measured intensity of (hkl) reflection
$I_0$(hkl)=standard intensity according to JCPDS card no 46-1212
n=number of reflections used in calculation.

17. The cutting tool insert according to claim 16, wherein TC(012) is 2.5 to 3.5.

18. The cutting tool insert according to claim 16, wherein TC(104), TC(110), TC(113), TC(116) are each less than 0.4.

19. The cutting tool insert according to claim 16, wherein TC(104), TC(110), TC(113), TC(116) are each less than 0.3.

20. A cutting tool insert comprising:
a cemented carbide substrate; and
a coating,
wherein the cemented carbide substrate comprises WC, 7 to 12 wt-% Co and 5 to 11 wt-% of cubic carbides of metals from groups IVb, Vb and VIb of the periodic table, a Co-binder that is highly alloyed with W and has an S-value of 0.79 to 0.89, a tungsten carbide phase having a mean intercept length of 0.7 to 1.4 µm and wherein the cemented carbide substrate includes a binder phase enriched and an essentially cubic carbide free surface zone of a thickness of 10 to 40 µm,
wherein the coating comprises at least one 2 to 12 µm alumina layer including columnar α-$Al_2O_3$ grains having a length to width ratio from 2 to 10 and a texture coefficient TC(hkl) of (hkl) reflections (012), (104), (110), (113), (024), (116),
wherein TC(012)>2.2 and TC(024)>0.6×TC(012), and wherein texture coefficient TC(hkl) is defined as $$TC(hkl) = \frac{I(hkl)}{I_0(hkl)}\left[\frac{1}{n}\sum\frac{I(hkl)}{I_0(hkl)}\right]^{-1}$$

where
I(hkl)=measured intensity of (hkl) reflection
$I_0$(hkl)=standard intensity according to JCPDS card no 46-1212
n=number of reflections used in calculation, and
wherein the coating further comprises a first layer adjacent the cemented carbide substrate including CVD Ti(C,N), CVD TiN, CVD TiC, MTCVD Ti(C,N), MTCVD Zr(C,N), MTCVD Ti(B,C,N), CVD HfN or combinations thereof, the first layer having a thickness of from 1 to 10 µm.

21. The cutting tool insert according to claim 20, wherein the thickness of the first layer is about 3 to 8 µm, the first layer is MTCVD Ti(C,N), and a total thickness of the coating is 7 to 15 µm.

22. The cutting tool insert according to claim 20, wherein TC(012) is 2.5 to 3.5.

23. The cutting tool insert according to claim 20, wherein TC(104), TC(110), TC(113), TC(116) are each less than 0.4.

24. The cutting tool insert according to claim 20, wherein TC(104), TC(110), TC(113), TC(116) are each less than 0.3.

25. The cutting tool insert according to claim 20, wherein the coating comprises a modified bonding layer including an Al concentration gradient, the modified bonding layer positioned between the first layer and the alumina layer.

26. The cutting tool insert according to claim 20, wherein TC(012) is 2.5 to 3.5 and TC(104), TC(110), TC(113), TC(116) are each less than 0.4.

* * * * *